(12) United States Patent
Matsumoto et al.

(10) Patent No.: US 6,245,661 B1
(45) Date of Patent: Jun. 12, 2001

(54) METHOD OF PRODUCING A WIRING FOR A SEMICONDUCTOR CIRCUIT

(75) Inventors: Shigeyuki Matsumoto, Atsugi; Osamu Ikeda, Tokyo, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/362,210

(22) Filed: Dec. 22, 1994

Related U.S. Application Data

(62) Division of application No. 08/261,232, filed on Jun. 14, 1994, now Pat. No. 5,404,046, which is a continuation of application No. 07/705,609, filed on May 24, 1991, now abandoned.

(30) Foreign Application Priority Data

May 31, 1990 (JP) .................................................. 2-139611
May 31, 1990 (JP) .................................................. 2-143731

(51) Int. Cl.[7] .............................................. H01L 21/4763
(52) U.S. Cl. .......................... 438/622; 438/629; 438/675; 438/681; 438/688
(58) Field of Search .................................... 437/189, 192, 437/195, 197, 230; 438/622, 629, 672, 674, 675, 681, 688, 687, FOR 358

(56) References Cited

U.S. PATENT DOCUMENTS

| | | | |
|---|---|---|---|
| 4,951,601 | * | 8/1990 | Maydan et al. ........................ 118/719 |
| 4,960,732 | * | 10/1990 | Dixit et al. ............................. 437/192 |
| 4,980,034 | * | 12/1990 | Volfson et al. ........................ 437/195 |
| 4,988,423 | * | 1/1991 | Yamamoto et al. ............. 204/192.17 |
| 5,019,531 | | 5/1991 | Awaya et al. .......................... 437/180 |
| 5,055,423 | * | 10/1991 | Smith et al. ........................... 437/187 |
| 5,141,897 | * | 8/1992 | Manocha et al. ..................... 437/228 |

FOREIGN PATENT DOCUMENTS

| | | | |
|---|---|---|---|
| 3815569 | 12/1988 | (DE) | .............................. H01L/21/88 |
| 3916622 | 11/1989 | (DE) | .............................. C23C/16/18 |
| 0021133 | 1/1981 | (EP) | .............................. H01L/21/90 |
| 0420594 | 4/1991 | (EP) | .............................. H01L/21/3205 |
| 58-158916 | * 9/1983 | (JP) | .............................. 438/FOR 358 |

OTHER PUBLICATIONS

Shigeeda, N., "Selective and Nonselective deposition of Aluminum . . . ", Rec. Electro. Commun. Eng. Consersazion, Tokobu University, Japan, 58(4), pp. 27–28, May 1990 (translation attached).*

"Photochemical Vapor Deposition of Aluminum Thin Films Using Dimethylaluminum Hydride", Mitsugu Hanabusa, et al., Japanese Journal of Applied Physics/Part 2: Letters 27 (1988), No. 8 Tokyo, Japan.

"Selective Electroless Metal Deposition for Integrated Circuit Fabrication", Chiu H. Ting, et al., Journal of the Electrochemical Society, No. 2, Feb. 1989, pp. 456–462, Manchester, NH, USA.

* cited by examiner

Primary Examiner—T. N. Quach
(74) Attorney, Agent, or Firm—Fitzpatrick, Cella, Harper & Scinto

(57) ABSTRACT

The semiconductor circuit device is provided with a first wiring layer connected to a semiconductor substrate through a contact hole in an insulation film formed on a main surface of the semiconductor substrate, and a second wiring layer connected with the first wiring layer through a through-hole in an interlayer insulation film formed on the first wiring layer, wherein the first wiring is substantially flat on the contact hole and the area of the through-hole is smaller than that of the contact hole.

3 Claims, 14 Drawing Sheets

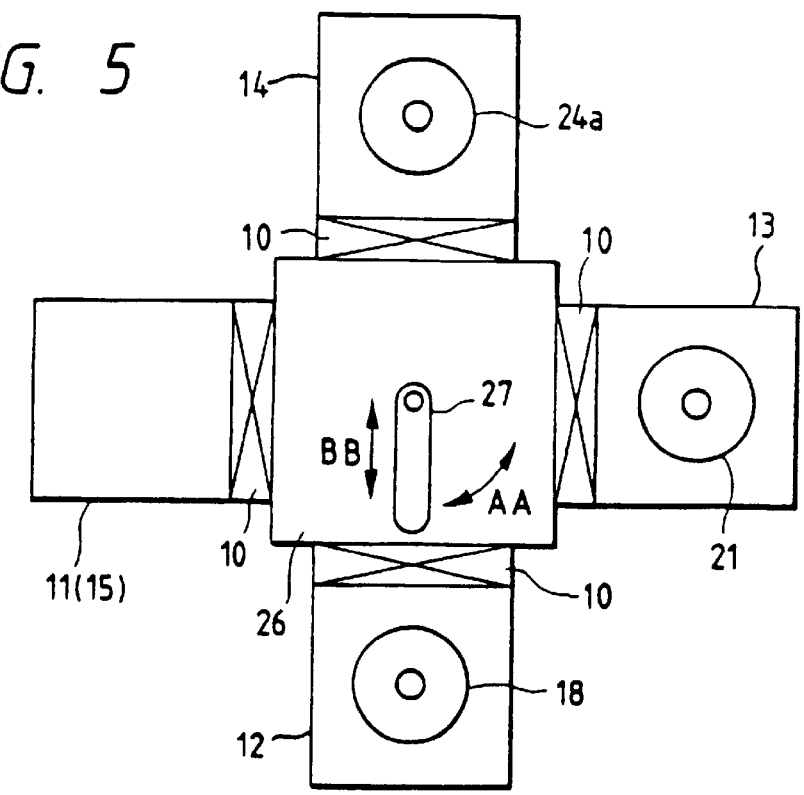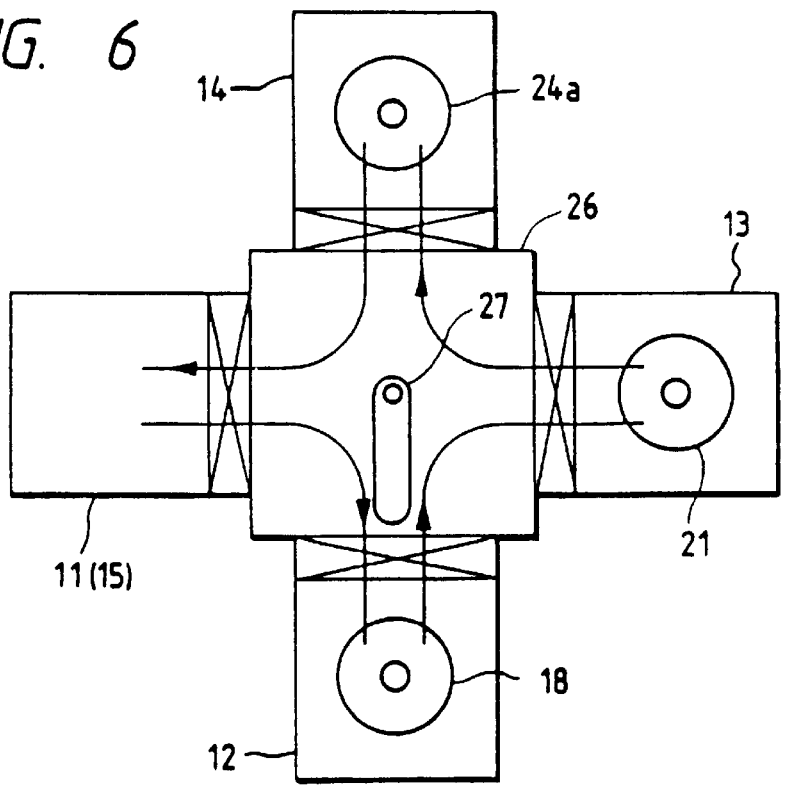

IN CVD PROCESSING CHAMBER

METHOD OF PRODUCING A WIRING FOR A SEMICONDUCTOR CIRCUIT

This application is a division of application Ser. No. 08/261,232, filed Jun. 14, 1994, U.S. Pat. No. 5,404,046, which is a continuation of application Ser. No. 07/705,609, filed May 24, 1991, abandoned.

BACKGROUND OF THE INVENTION

1. Field of the Invention

This invention relates to a semiconductor circuit device such as a memory, a photoelectric converting device, a signal processing device or the like adapted for use in various electronic appliances, a manufacturing method therefor, and a wiring forming method for a semiconductor circuit, and more particularly to a multi-layered wiring structure thereof.

2. Related Background Art

In recent years, the efforts for higher levels of integration have been directed toward the realization of miniaturized functional devices, such as the development of a MOS transistor with a submicron gate length.

For example, a MOS transistor of a gate length of 0.8 $\mu$m occupies an area of ca. 20 $\mu$m$^2$, and is suitable for a high level of integration.

However the conventional structure has been unable to provide sufficiently satisfactory characteristics even if the functional devices such as MOS transistors or bipolar transistors are sufficiently miniaturized to allow a high level of integration. This has been considered to be due to drawbacks in the process of forming fine functional devices, and the emphasis in developments has therefore been given to improvements in the manufacturing process.

However, the detailed investigation of the device structure and the manufacturing process by the present inventors has revealed that a development in the wiring structure significantly improves the production yield, with improvement in the performance.

More specifically, the conventional structure explained in the following has been associated with the drawback that, in the multi-layered wiring structure, the area occupied by the aluminum wirings of the second and third layers and by the through-holes in the first and second layers is increased, which hinders the higher integration of the fine device elements and also hinders the decrease of the parasitic capacitances which lead to delays in signals.

FIG. 18 is a schematic cross-sectional view of a multi-layered wiring structure in such a conventional semiconductor circuit device. In a two-layered wiring structure, through-holes of only one kind are required in order to connect the wirings of the first (lower) layer with those of the second (upper) layer, but, in a wiring structure involving three or more layers, through-holes of another kind are also required in order to connect the wirings of the second and third (uppermost) layer.

Such multi-layered wiring structure also poses a problem that the step in the interlayer insulation film becomes larger in the upper layer side. Such step becomes even larger if, as shown in FIG. 18A, a step h2 of the lower layer side, formed by an insulation film 1 and a wiring 2, overlaps with another step h1 of the upper layer, formed by another insulation film 3 and a wiring 4. Consequently it has been difficult to reduce the step height in the upper layer. The insulation film provided to cover such an increased step inevitably has a larger thickness in such stepped portion (step h1) than in the flat portion. If a through-hole 5 is formed in the insulation film of increased thickness with an ordinary photoresist mask 6, the etching proceeds in the lateral direction of the insulation film 3 but the bottom aperture area S2 of the through-hole 5 becomes smaller than the area S1 of the photoresist mask (for example $S1=5\times5$ $\mu$m$^2$; $S2=3\times3$ $\mu$m$^2$), so that the through-hole 5 becomes more difficult to open as the insulation film becomes thicker. In the conventional semiconductor device with multi-layered wirings, this problem has been avoided by designing the through-holes connecting the wirings of the (n+1)-th and (n+2)-th layers to be larger than those connecting the wirings of the (lower) n-th and (n+1)-th layers. In this manner the through-holes 5 can be formed with a suitable size between the wirings, so that the troubles in forming the connection resulting from the step or the increased film thickness can be prevented.

In FIG. 18B there are shown a semiconductor substrate 7, an insulation film 8, an Al wiring 9 of the first layer, a first interlayer insulation film 10, a first through-hole 11, an Al wiring 12 of the second layer, a second interlayer insulation film 13, a second through-hole 14, and an Al wiring 15 of the third layer.

In the illustrated structure it will be understood that the size $e_1$ of the contact hole CH is exceeded by the size $e_2$ of the first through-hole 11, which is in turn exceeded by that $e_3$ of the second through-hole 14. Such structure is for example disclosed in the Japanese Laid-open Patent Sho 59-117236.

FIG. 19 is a schematic view showing a wiring forming method for obtaining another multi-layered wiring structure in the conventional semiconductor circuit device.

In FIG. 19 there are shown, as an example, the wirings connected to a MOS transistor.

On the top surface side of a semiconductor substrate 16 there are formed source and drain areas 17, and a gate electrode 19 is formed across a gate insulation film 18 on a channel area between said source and drain.

On such substrate 16, an insulation film 20 is formed for example by a CVD process, and apertures (contact holes) CH are formed by patterning, for electrical contact with said source and drain areas (FIG. 19A). Subsequently aluminum is deposited for example by sputtering and patterned by wet etching into the form of desired wirings 21 (FIG. 19B).

Then the interlayer insulation film 22 is formed for example by a CVD process, and the through-hole TH is opened by patterning (FIG. 19C). Aluminum is then again deposited for example by sputtering and patterned by wet etching into the form of desired wirings 21, and the protective layer 23 is formed thereon (FIG. 19D).

However, because of such multi-layered structure, the wirings impose a significant influence on the performance of the device, and such influence can no longer be avoided by mere selection of the form and material of the wirings in consideration of the problems in the manufacturing process, as in the conventional technical concept.

Particularly in a photoelectric converting device such as an area sensor, the aperture rate is an important parameter governing the device characteristics, so that a structure enabling a reduction in the area of wirings in the light receiving part is desired. Also a flatter surface of the device is an essential condition for achieving miniaturization and improved functions, since otherwise:

1. the diameter of the through-holes, and the width and thickness of the wirings have to be increased further as the layers are piled up in the multi-layered wiring structure;

2. the uppermost protective layer may be cracked, thus leading to defects, if the device surface has a large step; and 3. if other films such as a color filter or an antireflective film are further superposed on the device surface, a fine patterning in such films becomes difficult of the device surface is not flat.

Also the requirements for the wiring itself have become far stricter than before. For example, in highly integrated devices such as 4M or 16M DRAM in which the gate length is 0.8 µm or shorter, the aspect ratio (depth/diameter) of the via hole in which aluminum or other metals have to be deposited is 1.0 or larger, and the diameter of such via hole is also as small as 1.0 µm or less. Thus there is required an aluminum deposition technology for a via hole of a large aspect ratio.

In the wirings formed by the procedure as shown in FIG. 19, a recessed RC is formed on the contact hole CH, and a recessed RT is formed on the through hole TH.

However such recesses are undesirable because they lead to a significantly stepped structure. Such recesses will deteriorate the production yield in the multi-layered wiring structure, and also generate noises from stray light, if applied to a photoelectric converting device.

Also since the filling of apertures and the film deposition on the insulation layer are conducted at the same time, the conventional film forming method gives rise to formation a gap as indicated by S in FIG. 20, drastically deteriorating the production yield of the semiconductor devices.

Furthermore the aluminum patterning with wet etching results in a fluctuating profile of the wiring, due to a side etching effect.

SUMMARY OF THE INVENTION

In consideration of the foregoing, an object of the present invention is to provide a semiconductor circuit device with a high performance and a high level of integration, and a method for producing the same.

Another object of the present invention is to provide a wiring forming method for a semiconductor circuit capable of forming a second wiring layer, constituting a major part of the wiring, in a self-aligning manner without the patterning operation by etching and with uniform profiles.

Still another object of the present invention is to provide a wiring forming method for a semiconductor circuit capable of forming wiring with satisfactory film quality, thereby allowing the manufacture of a semiconductor device with small signals delays.

The above-mentioned objects can be attained, according to the present invention, by a semiconductor circuit device provided with a first wiring layer connected to a semiconductor substrate through contact holes formed in an insulation film provided on a main surface of the said semiconductor substrate and a second wiring layer connected to said first wiring layer through through-holes formed in an interlayer insulation layer provided on said first wiring layer, wherein the device is featured by a the fact that said first wirings on the contact holes are substantially flat and that the area of each of the through-holes is smaller than that of each of said contact holes.

Also the present invention includes a semiconductor circuit device provided with a first wiring layer connected to a semiconductor substrate through contact holes formed in an insulation film provided on the main surface of the semiconductor substrate, a second wiring layer connected to the first wiring layer through first through-holes in a first interlayer insulation layer formed on the first wiring layer, and a third wiring layer connected to the second wiring layer through second through-holes in a second interlayer insulation layer formed on said second wiring layer, wherein the device is featured by the fact that said first wirings on said contact holes are substantially flag, and that the area of each of the first through-holes is smaller than that of each of the contact holes.

Furthermore the present invention includes a semiconductor circuit device provided with a first wiring layer connected to a semiconductor substrate through contact holes in an insulation film formed on the main surface of the semiconductor substrate and a second wiring layer connected to the first wiring layer through through-holes in an interlayer insulation layer formed on the first wiring layer, wherein said device is featured by a fact that the first wirings on the contact holes are substantially flat.

Furthermore the present invention includes a method for producing a semiconductor circuit device provided with a first wiring layer connected to a semiconductor substrate through contact holes in an insulation film formed on the main surface of the semiconductor substrate and a second wiring layer connected to the first wiring layer through through-holes in an interlayer insulation layer formed on the first wiring layer, comprising steps of forming the contact holes in said insulation film, selectively depositing a conductive material in the contact holes, and depositing a conductive material on said contact holes and on the insulation film, followed by patterning, thereby forming the first wiring layer.

Furthermore the present invention includes a method for forming a wiring connected through an aperture formed in an insulation layer to an underlying surface of a substrate in a semiconductor circuit, comprising a first step for selectively depositing a first conductive material in the aperture, a second step for forming a first wiring consisting of a second conductive material on the insulation layer and on the first conductive material, and a third step for forming a second wiring by depositing a third conductive material selectively on the first wiring.

The present invention sufficiently reduces the parasite capacitance, by selecting the area of the first through-hole to be smaller than that of the contact hole. Also it can significantly reduce the plan area occupied by the through-holes and the second wirings, thereby reducing the chip area and achieving a reduction in cost.

Also the present invention can provide a uniform cross-sectional profile of the wiring, as since a layer constituting a major part of the wirings can be formed in a self-aligning manner, without patterning by etching.

Furthermore the present invention can provide wirings with improved migration resistance and durability, since a material creating wirings of satisfactory quality can be deposited with satisfactory selectivity.

Furthermore the present invention can provide wirings with improved flatness and lowered contact resistance, thereby improving the step coverage and durability of the insulation film to be provided thereon and reducing delays in the signals.

BRIEF DESCRIPTION OF THE DRAWINGS

FIGS. 4 to 6 illustrate an example of a continuous metal film forming apparatus adapted for use in the present invention, wherein:

FIG. 4 is a schematic view of the apparatus arranged in the order of process steps;

FIG. 5 is a schematic plan view of the apparatus;

FIG. 6 is a schematic plan view in which the sequence of movement of a substrate is indicated by arrow;

DETAILED DESCRIPTION OF THE PREFERRED EMBODIMENTS

Figure 1:
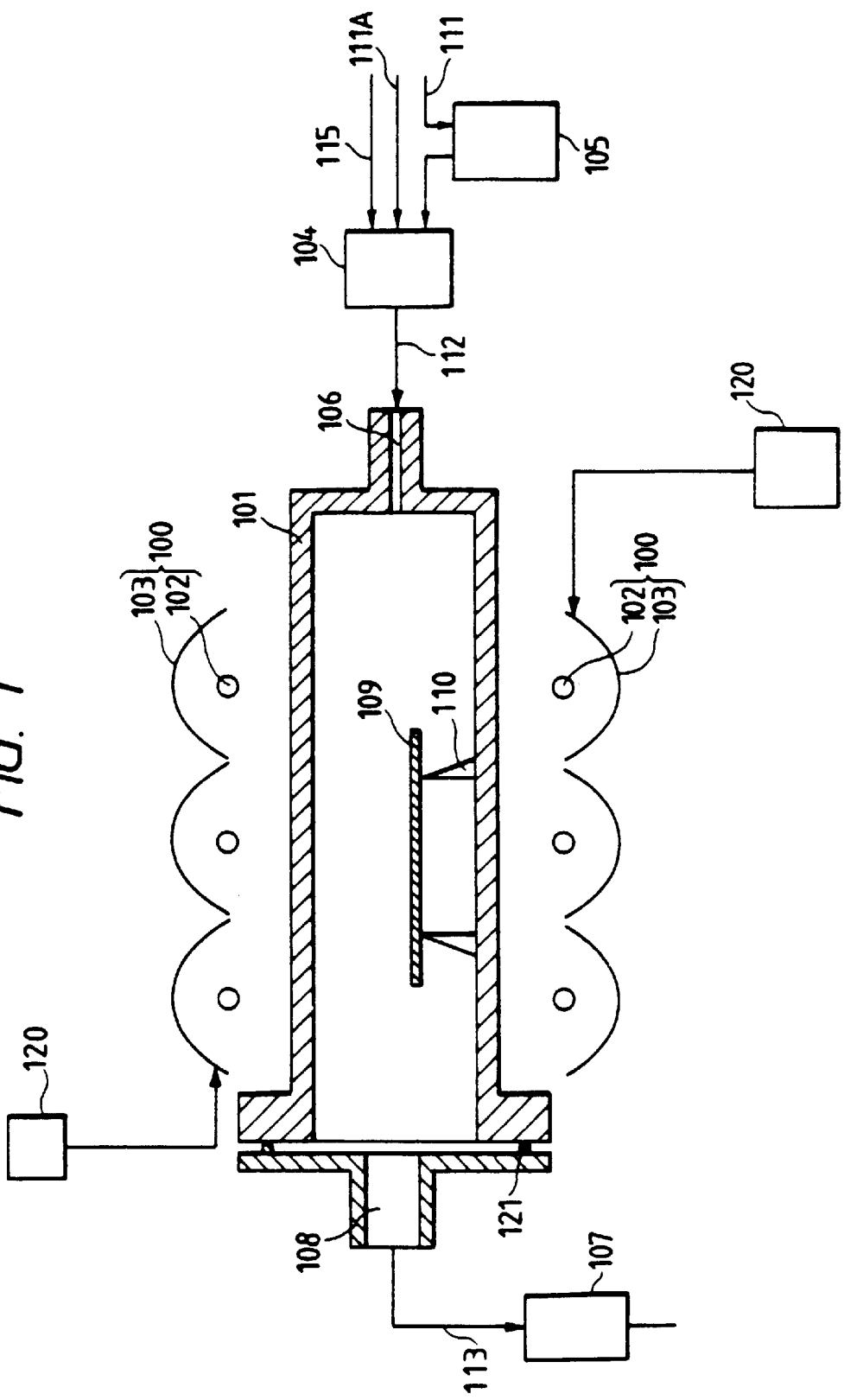
FIG. 1 is a schematic view of a metal film forming apparatus adapted for use in the present invention.

Prior to the detailed description of the present invention, the following is an explanation of the film forming method (Al-CVD method) for forming a metal film principally composed of aluminum (including a pure aluminum film) adapted for use in the present invention.

This method is suitable for filling a fine and deep aperture, such as a contact hole or a through hole, for example with an aspect ratio of unity or larger, with a metallic material, and is capable of highly selective deposition.

The metal film formed by this method shows an extremely excellent crystalline property, enough for generating monocrystalline aluminum, and is substantially free from carbon.

The method consists of forming a deposition film by surface reaction on an electron donating substrate, utilizing alkylaluminum hydride gas and hydrogen gas. An aluminum film of satisfactory quality can be deposited by heating the surface of the substrate in the presence of a gaseous mixture particularly consisting of alkylaluminum hydride including methyl radicals such as monomethylaluminum hydride (MMAH) or dimethylaluminum hydride (DMAH) as the raw material gas and hydrogen gas as the reaction gas.

This CVD method, if applied to a substrate having both an electron donating surface area and an electron non-donating surface area, permits formation of a single crystal of alluminum with satisfactory selectivity solely on the electron donating surface area.

The electron donating material is a material in which free electrons are present or intentionally generated and which has a surface capable of accelerating a chemical reaction by electron transfer with the molecules of raw material gas deposited onto said surface. In general metals and semiconductive materials fall into this category. Also metals and semiconductors having a thin oxide film on the surface belong to the electron donating materials of the present invention, since a chemical reaction can take place by electron transfer between the substrate and the deposited molecules of the raw material.

Examples of such electron donating materials include III–V compound semiconductors of two-, three- or multiple-element system obtained by combining elements of the group III such as Ga, In, Al etc. and elements of the group V such as P, As, N etc.; P, I and N-type semiconductors such as monocrystalline silicon and amorphous silicon; and metals, alloys and silicides such as tungsten, molybdenum, tantalum, copper, titanium, aluminum, titanium-aluminum, titanium nitride, aluminum-silicon-copper, aluminum-palladium, tungsten silicide, titanium silicide, aluminum silicide, molybdenum silicide and tantalum silicide.

On the other hand, examples of the electron non-donating material constituting a surface not causing selective deposition of Al or Al—Si include silicon oxide formed by thermal oxidation or CVD, glasses, oxide films and thermal nitride films such as BSG, PSG and BPSG; and silicon nitride formed by plasma CVD, low pressure CVD or ECR-CVD.

The above-explained Al-CVD method can also selectively deposit metal films principally composed of aluminum and containing modifying atoms, with excellent film quality.

For example, an electrode may be formed by selective deposition of various conductive materials such as Al—Si, Al—Ti, Al—Cu, Al—Si—Ti or Al—Si—Cu by the use of a mixed gaseous atmosphere employing, in addition to alkylaluminum hydride gas and hydrogen, a suitable combination of:

Si-containing gas such as $SiH_4$, $Si_2H_6$, $Si_3H_8$, $Si(CH_3)_4$, $SiCl_4$, $SiH_2Cl_2$ or $SiHCl_3$;

Ti-containing gas such as $TiCl_4$, $TiBr_4$ or $Ti(CH_3)_4$; and/or

Cu-containing gas such as copper bisacetylacetonate $Cu(C_5H_7O_2)_2$, copper bisdipivaloymethanite $Cu(C_{11}H_{19}O_2)_2$ or copper bishexafluoroacetylacetonate $Cu(C_5HF_6O_2)_2$.

Also since the Al-CVD method is excellent in selectivity and provides satisfactory surface characteristics on the deposited film, a metal film can be obtained that is suitable and widely usable for the wirings of a semiconductor device, by employing a non-selective film forming method in a next deposition step to form a metal film composed solely or principally of aluminum not only on the selectively deposited aluminum film mentioned above but also on the $SiO_2$ insulation film. This method will be explained later as a preferred embodiment of the present invention.

Examples of such metal films include combinations of selectively deposited Al, Al—Si, Al—Ti, Al—Cu, Al—Si—

Ti or Al—Si—Cu and non-selectively deposited Al, Al—Si, Al—Ti, Al—Cu, Al—Si—Ti or Al—Si—Cu. Said non-selective film deposition may be achieved by CVD other the aforementioned Al-CVD, or by sputtering. Also the non-selectively deposited metal film may be principally composed of Cu, W, Mo etc.

Description of Metal Film Forming Apparatus (1)

As an example of the film forming apparatus adapted for use in the present invention, the following is an explanation of a first apparatus employing direct heating with lamps.

FIG. 1 illustrates a metal film forming apparatus adapted for use in the present invention.

Heating means 100 is provided a plurality of sets of halogen lamps 102 and mirrors 103 on the top side and bottom side of a substrate 109, and can arbitrarily set the surface temperature of the substrate by controlling the current to the lamp by means of a controller 120 connected to an unrepresented power source.

The substrate 109, on which the metal film is to be formed, is placed on a substrate holder 110, positioned in a transparent and insulating reaction chamber 101 composed for example of fused quartz. A gas supply system includes a mixer 104, a bubbler 105, gas supply lines consisting of a first gas line 111 for bubbling hydrogen gas, leading to the mixer 104 through the bubbler 105 containing DMAH therein and a second gas line 111A for introducing hydrogen into the mixer 104, and a gas introduction line 112 for introducing the mixture of DMAH gas and hydrogen gas into the reaction chamber 101 through a gas inlet 106. An additional gas line 115 is provided for introducing another gas. An exhaust system 107 includes a pump, and an exhaust line 113 communicating with a gas outlet 108. A sealing ring 121 is provided for hermetic sealing.

The above-explained film forming apparatus is capable of stabilizing the surface of the substrate at a desired temperature by heating within 5 seconds, and is capable of providing a throughput as high as 15 to 30 5"-wafers per hour.

The direct heating means is composed of suitable light sources such as halogen lamps or xenon lamps.

The direct heating means heats the substrate surface by direct conversion of the energy from the means into heat, in contrast to heating by heat transmission, in which, as in resistance heating, the substrate surface is heated by the heat transmitted from a stage supporting the substrate to the bottom surface thereof and then to the top surface thereof. It is to be noted that this operation mode is different from the photo-CVD method utilizing ultraviolet light and involving photoexcitation.

Description of Metal Film Forming Method (1)

The following is a detailed explanation on the metal film forming method adapted for use in the present invention, with reference to FIG. 2.

Figure 2A:
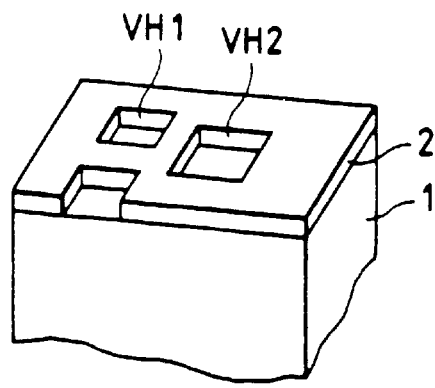
FIGS. 2A to 2D are schematic views for explaining the metal film forming method.

At first there is prepared a substrate for deposition, composed of a semiconductive or conductive substrate 1 with an electron donating surface, bearing thereon an insulation film 2 with apertures VH1, VH2 of different sizes. The surface of the insulation film 2 constitutes an electron non-donating surface (FIG. 2A).

Figure 2B:
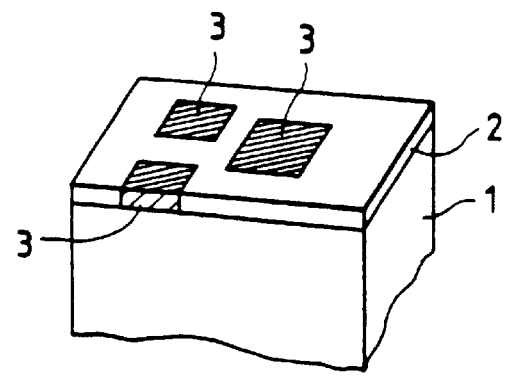

Then a metal film principally composed of aluminum is deposited by a CVD method utilizing alkylaluminum hydride and hydrogen. For this purpose, the substrate is placed in the reaction chamber 101. The chamber is then evacuated and a gaseous mixture of alkylaluminum hydride and hydrogen is introduced therein. With the substrate surface temperature maintained within a range of 260°–440° C., preferably 270°–440° C. with the lamps, aluminum is selectively deposited in the apertures. Based on the deposition speed experimentally determined in advance, aluminum is deposited to a level substantially equal to the surface of the insulation film (FIG. 2B).

Figure 2C:
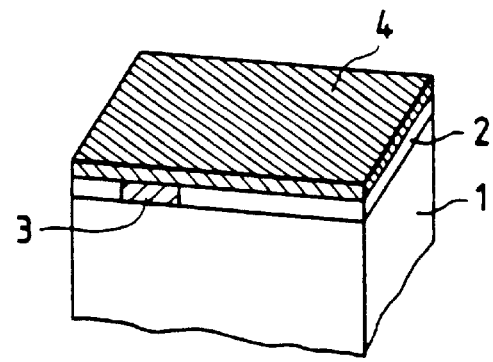
Figure 2D:
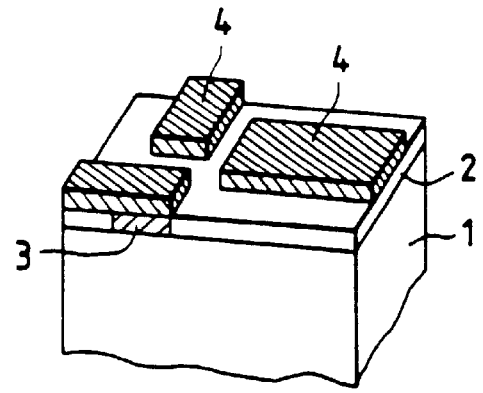

Then aluminum is deposited over the entire surface, for forming the wirings for the semiconductor device. For this purpose, the substrate is taken out from the reaction chamber shown in FIG. 1, placed in the reaction chamber of another film depositing apparatus and is subjected to aluminum deposition by a known sputtering or CVD method (FIG. 2C).

The mechanism of aluminum deposition is presently understood in the following manner.

Figure 8A:
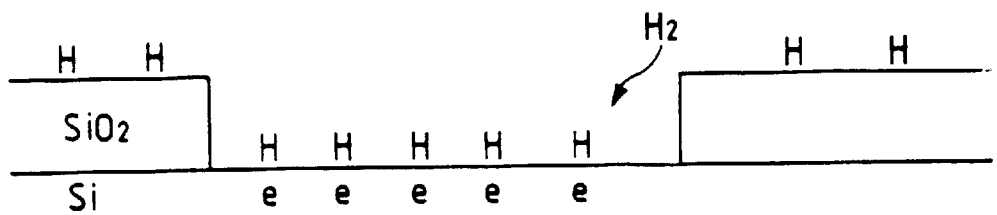
FIGS. 8A to 8D are schematic views showing the mode of selective aluminum deposition.
Figure 8B:
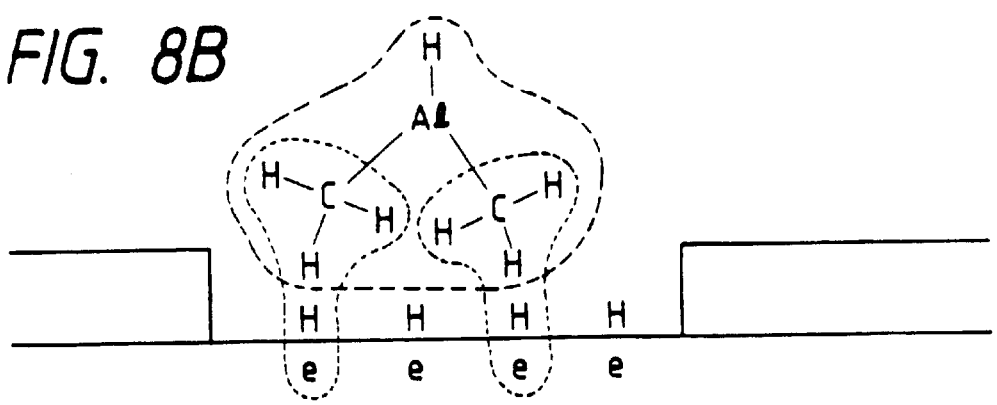
Figure 8C:
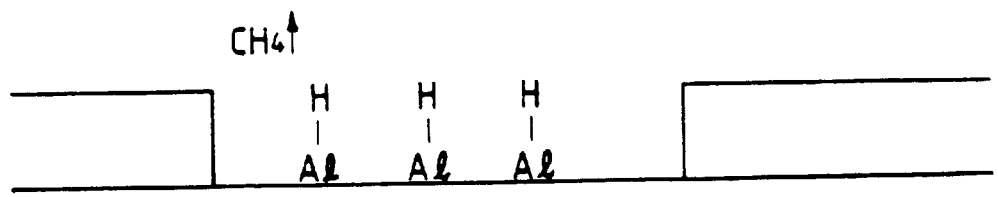

FIG. 8A shows the electron donating substrate, involving electrons, with hydrogen atoms absorbed thereon. If a DMAH molecule approaches to the substrate with the methyl radicals positioned closer thereto, the electron of the substrate causes cleavage of the bond between aluminum atom and a methyl radical (FIG. 8B and 8C) according to a reaction equation:

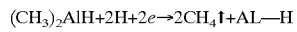

$$(CH_3)_2AlH + 2H + 2e \rightarrow 2CH_4\uparrow + AL-H$$

Figure 8D:
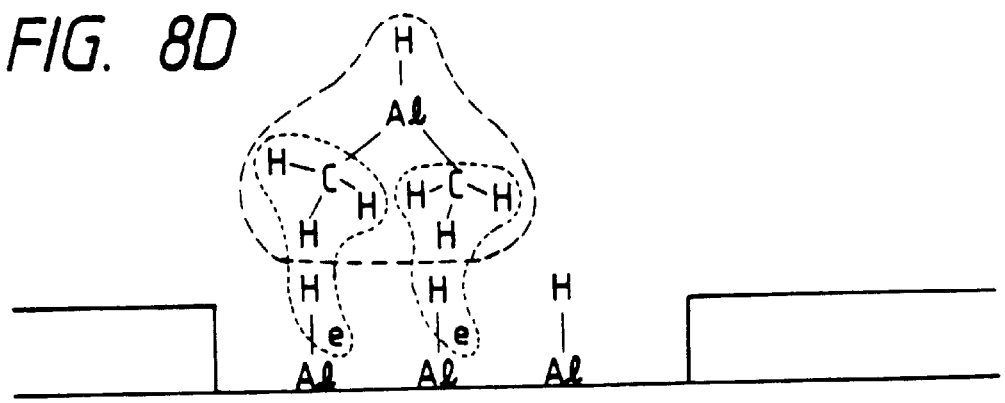

This reaction proceeds further by the hydrogen atoms remaining on the deposited aluminum, including free electrons therein FIG. 8D). If the hydrogen atoms become deficient, the hydrogen molecules in the reaction gas are decomposed on the substrate to replenish the hydrogen atoms. On the other hand, on an electron non-donating surface which lacks electrons, the above-explained reaction does not proceed so that the aluminum deposition does not take place.

In order to obtain a high deposition speed, therefore, it is important to accelerate a dissociation-absorption reaction which decomposes the hydrogen molecules into hydrogen atoms and causes absorption of said atoms onto the electron donating surface. The direct heating performs this role and accelerates the selective deposition.

Figure 3:
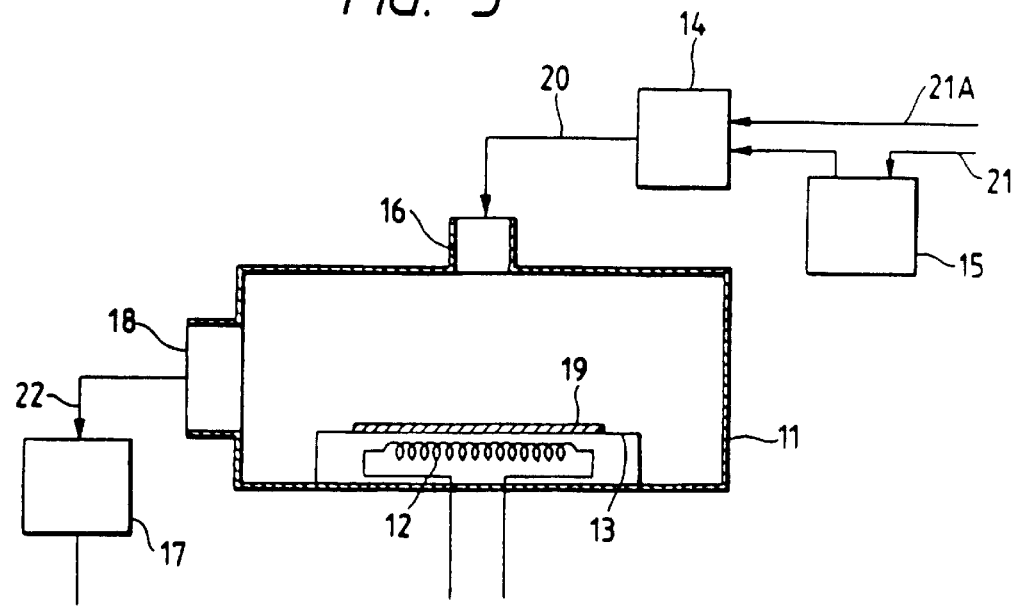
FIG. 3 is a schematic view of an example of a metal film forming apparatus.

A comparison was made between an Al film formed with DMAH as alkylaluminum hydride and $H_2$ in the apparatus shown in FIG. 3, employing direct heating with lamps, and a similar Al film formed by heating the substrate to 260° C. with resistance heating.

The Al film obtained by resistance heating was free from carbon content and showed satisfactory resistivity, but the maximum film deposition speed could not exceed 800 Å/min. A higher substrate temperature was tried to increase the deposition speed, but resulted in drawbacks such as deterioration of surface morphology, decrease in resistivity and loss of selectivity. Thus the present inventors have found that a mere increase in the substrate temperature results in insufficient reproducibility.

Also an increased DMAH flow rate was tried by the present inventors to increase the deposition speed, but it resulted in deterioration in surface morphology, indicating insufficient reproducibility.

On the other hand, the pure aluminum deposited in the apertures by the above-explained method of the present invention has a monocrystalline structure, with:

(1) low frequency of hillock formation; and (2) low frequency of alloy spike formation.

Also for the purpose of comparison with the direct heating with lamps etc., as in the above-explained case of pure aluminum deposition, the present inventors formed an Al—Si film by heating the substrate at 260° C. by resistance heating, and employing DMAH as alkylaluminum hydride, silicon-containing gas and hydrogen gas.

The obtained Al—Si film was free from carbon and showed satisfactory resistivity, but the maximum film deposition speed could not exceed 800 Å/min. An increased substrate temperature was tried to increase the deposition speed, but resulted in drawbacks such as deterioration of surface morphology, decrease in resistivity and loss of selectivity. On the other hand, the Al—Si film deposited in the apertures by the direct heating method showed a satisfactory crystalline structure, with a low frequency of hillock formation and of alloy spike formation.

As the above-explained method achieves deposition with excellent selectivity, there can be obtained a metal film adapted for use as the wirings of a semiconductor device, by employing a non-selective deposition method as the next deposition step, thereby forming a metal film principally composed of Al—Si not only on the selectively deposited Al—Si film but also on the $SiO_2$ insulation film.

In this case the silicon-containing gas is introduced to the mixer 104 through the third gas line 115.

The above-explained film forming apparatus can stabilize the substrate surface at a desired temperature by heating within 5 seconds, as in the case of pure aluminum deposition, and can achieve a throughput of 15 to 30 5-inch wafers per hour.

The following is an explanation of another embodiment utilizing a metal film forming apparatus with multiple chambers, wherein the substrate is at first subjected, in a first film forming chamber, to selective deposition of a metal film principally composed of aluminum by a CVD method utilizing alkylaluminum hydride and hydrogen, and is then transferred to a second film forming chamber, without exposure to the external atmosphere, for metal film formation over the entire surface of the substrate.

Description of Metal Film Forming Apparatus (2)

The following is an explanation of an apparatus with multiple chambers, as another example of the metal film forming apparatus adapted for use in the present invention.

Figure 4:
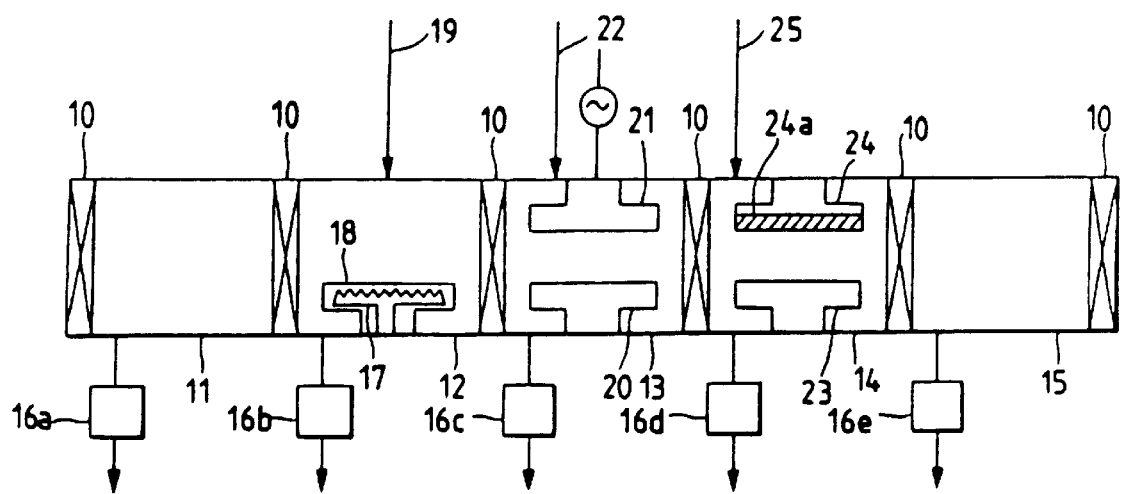

FIGS. 4 to 6 illustrate a continuous metal film forming apparatus adapted for use in the present invention.

As shown in FIG. 4, the apparatus is composed of a load lock chamber 11, a CVD reaction chamber (first film forming chamber) 12, an Rf etching chamber 13, a sputtering chamber (second film forming chamber) 14 and a load lock chamber 15, which are rendered sealable from the external atmosphere and mutually communicatable by means of gate valves 10 and can be respectively made vacuum or reduced in pressure by vacuum systems 16a–16e. The load lock chamber 11 is provided for eliminating the atmosphere of the substrate and replacing it with $H_2$ prior to the deposition, in order to improve the throughput. The next CVD reaction chamber 12, for selective deposition onto the substrate under normal or reduced pressure, is provided therein with a substrate holder 18 having a resistance heater 17 (for heating to 200–430° C.) and is also provided with a CVD gas supply line 19 for introduction of the CVD gas. The RF etching chamber 13, for cleaning (etching) of the substrate surface in Ar atmosphere after the selective deposition, is provided therein with a substrate holder 20 to be heatable to 100°–250° C. and an Rf etching electrode 21, and is further provided with an Ar gas supply line 22. The next sputtering chamber 14, for non-selective deposition of a metal film onto the substrate by sputtering in Ar atmosphere, is provided therein with a substrate holder 23 to be heated to 200°–250° C. and a target electrode 24 for mounting a sputter target 24a, and is further provided with an Ar gas supply line 25. The final load lock chamber 15, for adjustment of the substrate after metal film deposition prior to the exposure to the external atmosphere, is designed to be capable of replacing atmosphere with $N_2$.

The above-explained continuous metal film forming apparatus is illustrated in FIG. 4 in an extended form following the process steps, but in practice it is constructed in a structure shown in FIG. 5, in which the load lock chamber 11, CVD reaction chamber 12, Rf etching chamber 13, sputtering chamber 14 and load lock chamber 15 are mutually connected and relayed by a transport chamber 26. In this structure, the load lock chamber 11 also serves as the chamber 15. In the transport chamber 26 sealed from the external atmosphere, there is provided an arm (transport means) 27 which is rotatable in both directions A—A and is extendable and retractable in directions B—B, whereby the substrate can be transferred in succession from the load lock chamber 11 to the CVD reaction chamber 12, Rf etching chamber 13, sputtering chamber 14, and finally to the load lock chamber 15 by means of the arm 27, without exposure to the external atmosphere, as indicated by arrows in FIG. 6.

Figure 7:
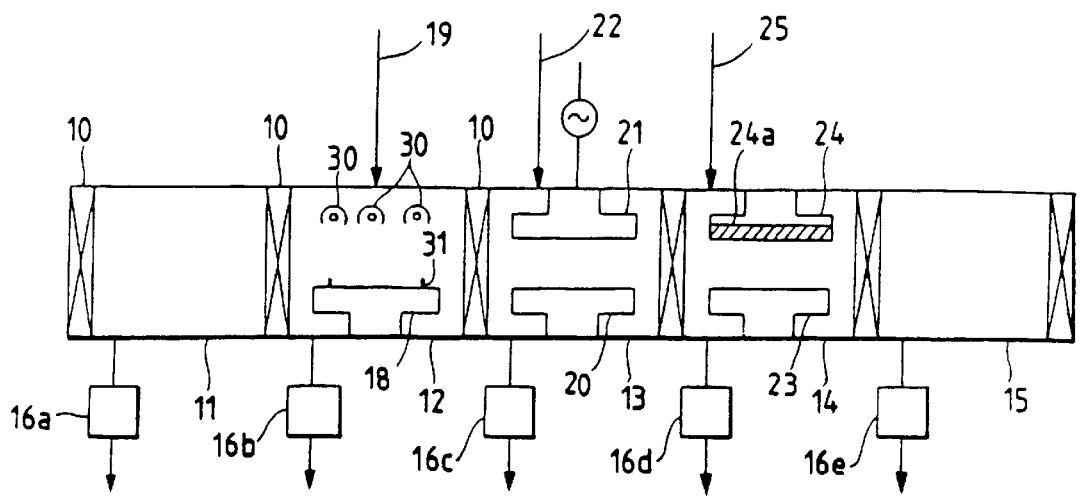
FIG. 7 is a schematic view of another example of the continuous metal film forming apparatus adapted for use in the present invention.

FIG. 7 shows another example of the continuous metal film forming apparatus, wherein same components as those in FIG. 4 are represented by same numbers. The apparatus shown in FIG. 7 is different from that in FIG. 4 in that the substrate surface is directly heated by halogen lamps 30, and such direct heating brings about an increase in the deposition speed. For the purpose of such direct heating, the substrate holder 12 is provided with projections 31 for supporting the substrate in a floating state.

Among the heating methods applicable to the above-explained deposition method, direct heating the substrate being heated by direct transmission of energy from heating means to the substrate) may be achieved by heating with lamps such as halogen lamps or xenon lamps. Also resistance heating may be achieved by a heat generating member provided in a substrate support member, provided in a film depositing space, for supporting the substrate to be subjected to film deposition.

The apparatus shown in FIGS. 4 to 7 may also be utilized for the deposition of an aluminum film containing modifying atoms. In such case, there will be provided a gas supply line for introducing a gas other than the organic aluminum compound gas.

Figure 9:
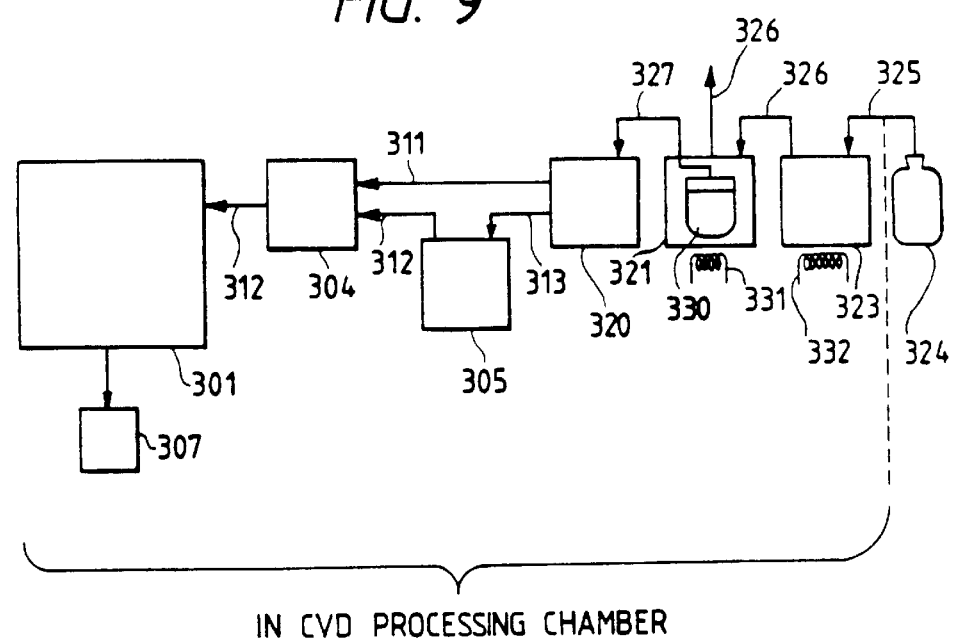
FIG. 9 is a schematic view of a CVD apparatus adapted for use in the present invention.

The following is an explanation with reference to FIG. 9, of the gas supply system advantageously employable for the above-explained metal film forming apparatus.

The gas supply line 312 to the reaction chamber 301 is connected to the mixer 304, which in turn is provided with a hydrogen gas supply line 311 connected to a cooler 320, and a raw material gas supply line 312 connected to a bubbler 305. The bubbler is connected, through a carrier gas supply line 313 for bubbling the liquid raw material, to said coller 320.

At the upstream side there is connected, through a line 327, a hydrogen purifier 321.

The interior of said hydrogen purifier 321 is divided, by a palladium membrane, into a purifying cylinder and a primary chamber, and a raw material hydrogen supply line 326 is connected to the primary chamber outside the palladium membrane. The primary chamber is also provided with a gas exhaust line 326, for discharging a part of the raw material hydrogen. A heating coil 331 is provided.

A pre-heating chamber 323 effects preliminary heating of raw material hydrogen by means of a heating coil 332.

The CVD apparatus is integrally composed of the above-explained gas supply system, the vacuum system 307 and the reaction chamber.

A preferred structure includes the hydrogen purifier 321 incorporated in the main body of the CVD apparatus in such a manner that the length of the piping from the purifying cylinder 330 to the CVD reaction chamber 312 does not exceed 1.5 m.

Naturally the number of junctions and valves in the pipings is minimized.

The above-explained CVD apparatus is installed in a clean room while a bomb 324 containing the raw material hydrogen is placed outside, and both are connecting by a gas line 325. The pipings are made of electrolytically polished stainless steel.

The gas supply is conducted in the following manner. The hydrogen, supplied from the bomb 324 through the line 325 in excess of 10 meters, is heated to about 400° C. in the pre-heating chamber 325, and is purified by the palladium membrane to about 420° C. Thus the purifying cylinder 330 contains hydrogen with a purity of 99.99995% or higher, while the primary chamber contains hydrogen with a higher impurity concentration. A suitable amount of hydrogen is discharged to the exterior through the discharge line 326, in order that the impurity concentration does not become excessively high.

The purified hydrogen is cooled by the cooler 320, and is partly supplied directly to the mixer 304 and also partly supplied, as bubbling hydrogen gas, to the bubbler 305.

Description of Metal Film Forming Method (2)

The following is a detailed explanation of another embodiment of the metal film forming method of the present invention, with reference to FIGS. 2 and 4.

At first a substrate, explained in the foregoing description (1) and shown in FIG. 2A, is placed in the CVD reaction chamber 12 shown in FIG. 4, and alkylaluminum hydride gas and hydrogen gas are introduced from the gas supply line 19.

With the substrate maintained at a temperature range of 260°–440° C., preferably 270°–440° C., aluminum is selectively deposited in the apertures (FIG. 2B).

The substrate bearing the selectively deposited aluminum thereon is transferred, while being separated from the external atmosphere, to the etching chamber 13 shown in FIG. 4, for brief surface etching, and then is transferred again to the reaction chamber 14, in a similar state, for the deposition of a metal film over the entire surface for example by sputtering (FIG. 2C).

The aluminum deposited in the apertures by the above-explained method shows a monocrystalline structure, with:

(1) low frequency of hillock formation; and (2) low frequency of alloy spike formation.

As the above-explained method shows excellent selectivity, a metal film can be obtained that is suitable for the wirings of a semiconductor device, by employing a non-selective deposition method in the next process step, thereby forming a metal film principally composed of aluminum not only on the selectively deposited aluminum film but also on the insulation film composed for example of $SiO_2$.

A similarly excellent crystalline structure can be obtained also with Al—Si film. It is therefore possible to obtain a metal film suitable for the wirings of a semiconductor device, by employing a non-selective deposition method as the next process step, thereby forming a metal film composed solely or principally of aluminum not only on the selectively deposited Al—Si film but also on the insulation $SiO_2$ film.

As explained in the foregoing, the present invention improves the interface characteristics between the aluminum in the apertures and that on the insulation film, thereby providing a metal film for wirings with sufficiently low contact resistance.

The following is an explanation of preferred embodiments of the present invention.

Figure 10A:
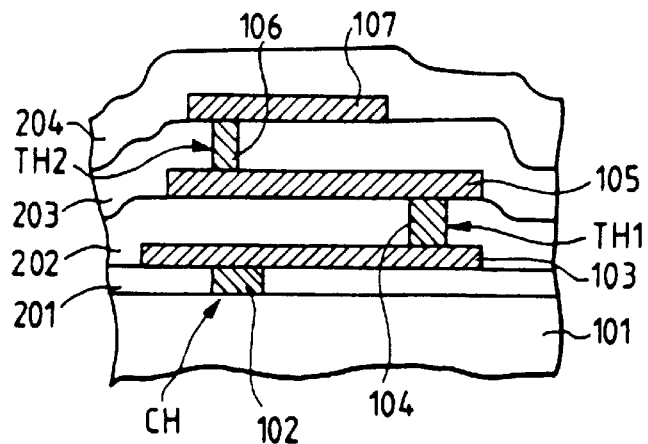
FIGS. 10A to 10C are schematic cross-sectional views of multi-layered wiring structures of a semiconductor circuit device.

FIG. 10A illustrates a multi-layered wiring structure of the present invention, in a schematic cross-sectional view.

On a semiconductor substrate 101 there is provided an insulation film 201 with a contact hole CH. A first wiring layer 103 is provided on the insulation film 201 and is in contact with the semiconductor substrate 101 through a conductor 102 in the contact hole. The first wiring layer 103 is overlaid by a first interlayer insulation film 202, and is in contact with a second wiring layer 105 provided thereon, through a conductor 104 in a first through-hole TH1. Further provided thereon is a second interlayer insulation film 203, and a third wiring layer 107 provided thereon is in contact with the second wiring layer 105 through a conductor 106 in a second through-hole TH2 formed in the second interlayer insulation film 203 and is finally covered by a protective film 204.

The sizes of said contact hole CH, first through-hole TH1 and second through-hole TH2 satisfy a relationship $$CH > TH1 > TH2.$$

Such smaller-sized apertures in the upper layers reduce the area occupied by contact portions, thereby enabling a higher density of wirings and increasing the freedom in the shapes of the wirings.

Figure 10B:
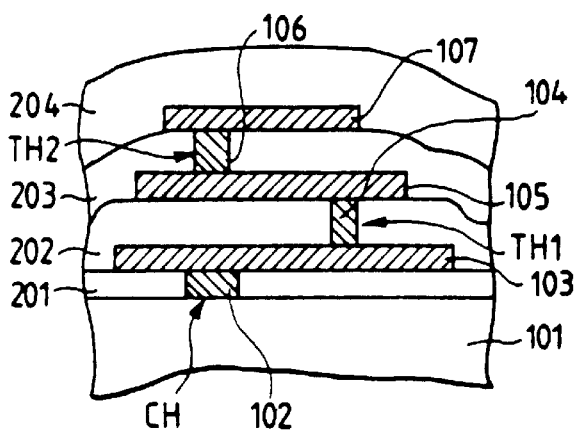

FIG. 10B shows another example of the present invention, wherein the sizes of the contact hole CH, first through-hole TH1 and second through-hole TH2 satisfy the following relationship:

$$CH > TH1 \leq TH2$$

and CH and TH2 preferably satisfy a relationship $CH \geq TH2$.

Figure 10C:
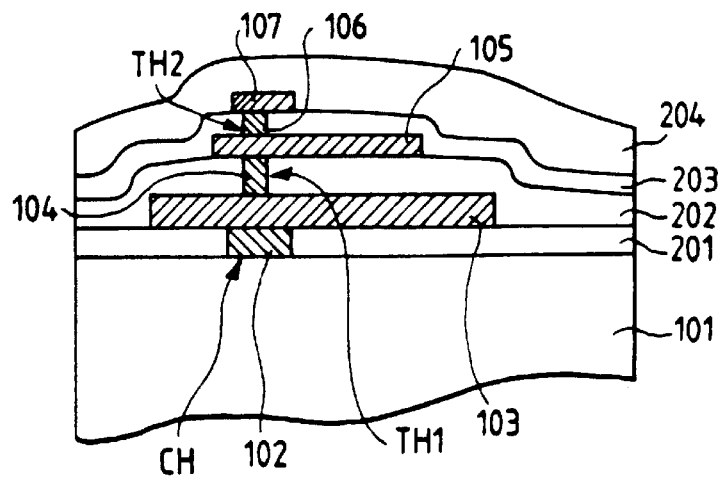

FIG. 10C shows still another example of the present invention, wherein the contact hole CH, first through-hole TH1 and second through-hole TH2 are positioned substantially along a straight line, and satisfy a size relationship:

$$CH > TH1 \leq TH2$$

and an additional relationship $CH \geq TH2$ is preferred. As shown in this example, positioning of CH, TH1 and TH2 along a substantially straight line further increases the design freedom in comparison with other examples, and allows the transistors to have a higher packing density.

The contact hole, designed with a contact resistance in a practical range for a high level of integration, preferably has a size of 0.6–0.8 $\mu m^2$ and an aspect ratio of 0.8–1.4.

Also the first through-hole preferably has a size of 0.4–0.6 $\mu m^2$ while satisfying the above-explained relationship, and an aspect ratio of 1.0–2.5. Also the second through-hole preferably has a size of 0.5–0.7 $\mu m^2$ and an aspect ratio of 1.0–2.5.

In the examples shown in FIGS. 10A and 10B, the contact hole and/or the first and/or second through-hole is filled by selective deposition, and the first to third wiring layers are thereafter formed by non-selective deposition of a conductive material.

Consequently the surface above the contact hole or through-hole is free from irregularities or steps as in the conventional art, so that each wiring layer has a flat top surface and the production yield is not deteriorated by the above-explained size relationship of the contact hole and/or the through-holes.

Each of the components constituting the above-explained semiconductor circuit device is composed of the material explained in the following.

The semiconductor substrate 101 is provided with semi-conductive areas, formed for example by ion implantation or thermal diffusion, constituting various devices such as MOS transistor, bipolar transistor, accumulating capacitor, diffusion resistor etc.

The insulation film 201 can be composed of a $SiO_2$ film or a silicon nitride film formed by thermal oxidation.

The first and second interlayer insulation films 202, 203 can be composed, of an inorganic material, for example a silicon oxide film formed by thermal oxidation, CVD or sputtering, a film of PSG, BSG or BPSG, a silicon nitride film or a silicon nitride oxide film formed by thermal nitrogenation or sputtering, or an organic insulation film such as SOG or polyimide. The protective layer 204 can be composed of a similar material. These films can be made even flatter by etch back.

The wirings can be composed of Al, Cu, Mo, W, Au, Ta, Pd, or a conductive material principally composed of Al such as Al—Si, Al—Si—Ti, Al—Ti, Al—Si—Cu, Al—Cu or Al—Pd, or a silicide of low resistance such as polycrystalline silicon, monocrystalline silicon, $WSi—TiSi_2$, $TaSi_2$, or MoSi, Particularly preferred materials for the present invention are Al-containing materials, more preferably monocrystalline Si or conductive materials principally composed of Al such as Al—Si, Al—Cu etc.

Each of said insulation films 201, 202, 203 and said first, second and third wiring layers is composed of a single layer, but it may naturally be constituted by plural layers.

The following is a further explanation of the film depositing method for forming the wirings of such Al-containing material.

This method is capable of filling the contact hole or the through-hole with a wiring material of satisfactory quality, with a flat surface, so that the insulation film on such contact hole or through-hole shows very little surface irregularity, in the multi-layered wiring structure. Consequently the surface irregularity or step, which increases with the formation of the contact hole or through-hole in the conventional technology, does not increase but remains very small according to the present invention, so that the production yield is not deteriorated by the formation of such holes but is significantly improved in comparison with that in the prior art.

[Example]

The following are experimental results indicating the superiority of the above-explained Al-CVD method and the satisfactory quality of the Al film deposited by said method in the apertures.

There were prepared plural substrates, each consisting of an N-type monocrystalline silicon wafer, provided thereon with a thermally oxidized $SiO_2$ film of a thickness of 8000 Å, in which apertures of different sizes from 0.25×0.25 $\mu$m to 100×100 $\mu$m were formed by patterning to expose the underlying monocrystalline silicon (samples 1—1).

These samples were subjected to the Al film formation by the Al-CVD method, employing DMAH as the raw material gas and hydrogen as the reaction gas, with a total pressure of 1.5 Torr and a DMAH partial pressure of $5.0 \times 10^{-3}$ Torr, and with the substrate surface temperatures selected in a range of 200°–490° C. by direct heating under the regulation of electric power supplied to the halogen lamps. The obtained results are summarized in Table 1.

TABLE 1

| Substrate surface temp. (° C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (A/min.) | ← 1000–1500 → | | | ← 3000–5000 → | | | | | | | | | | | |
| Throughput (wafer/hr) | ← 7–10 → | | | ← 15–40 → | | | | | | | | | | | |
| Si linear defects | ← not observed → | | | | | | | | | | | | | | |
| Carbon content | ← not observed → | | | | | | | | | | | | | | |
| Resistivity ($\mu\Omega$cm) | ← 2.7–3.3 → | | | ← 2.8–3.4 → | | | | | | | | | | | |
| Reflectance (%) | ← 8.5–9.5 → | | | ← 90–95 → | | | | | | | ← ca. 60 → | | | | |
| Hillock (>1 $\mu$m) density ($cm^2$) | ← 1–$10^2$ → | | | ← 0–10 → | | | | | | | ← $10–10^4$ → | | | | |
| Spike formation (%) destruction frequency of 0.15 $\mu$m junction | ← 0 → | | | | | | | | | | ← 0–30 → | | | | |

As will be apparent from Table 1, aluminum was deposited in the apertures with a deposition speed as high as 3000–5000 Å/min. at the substrate surface temperature of 260° C. or higher obtained by direct heating.

The Al film in the apertures, obtained in a substrate surface temperature range of 260°–440° C., showed satisfactory characteristics, with no carbon content, a resistivity of 2.8–3.4 $\mu\Omega$cm, a reflectance of 90–95%, a hillock ($\geq 1$ $\mu$m) density of 0–10, and an almost zero spike formation (frequency of destruction of 0.15 $\mu$m junction).

On the other hand, though the film quality obtained in a surface temperature range of 2000°–250° C. was somewhat inferior to that obtained in the temperature range of 260°–440° C., it is considerably better than that obtainable with the conventional technology, but the deposition speed could not exceed 1000–1500 Å/min. and the through-put was in a relatively low range of 7–10 wafer/hr.

At the substrate surface temperature equal to or higher than 450° C., the quality of the Al film in the apertures were deteriorated, with a reflectance of 60% or lower, a hillock ($\geq 1$ $\mu$m) density of $10–10^4$ $cm^{-2}$ and an alloy spike formation of 0–30%.

The following is an explanation of how the above-explained method can be advantageously applied to the apertures such as contact holes or through-holes.

The method can be advantageously applied to the contact holes or through-holes composed of the materials explained in the following.

The Al film formation was conducted on the following substrates (samples) under the same conditions as in the Al film formation on the above-mentioned samples 1—1.

Samples 1–2 were prepared by forming, on monocrystalline silicon constituting a first substrate surface material, a silicon oxide film constituting a second substrate surface material by means of CVD method, and forming apertures by a photolithographic process to locally expose the surface of monocrystalline silicon. The $SiO_2$ film was 8000 Å thick, and the apertures were sized from 0.25×0.25 µm to 100×100 µm. (Such sample will hereinafter be represented as "CVD $SiO_2$ (or simply $SiO_2$)/monocrystalline silicon".)

There were also prepared a sample 1–3 of boron-doped oxide film formed by normal pressure CVD (BSG)/monocrystalline silicon; a sample 1–4 of phosphor-doped oxide film formed by normal pressure CVD (PSG)/monocrystalline silicon; a sample 1–5 of boron- and phosphor-doped oxide film formed by normal pressure CVD (BSPG)/monocrystalline silicon; a sample 1–6 of nitride film formed by plasma CVD (P-SiN)/monocrystalline silicon; a sample 1–7 of thermal nitride film (T—SiN)/monocrystalline silicon; a sample 1–8 of nitride film formed by low pressure CVD (LP-SiN)/monocrystalline silicon; and a sample 1–9 of nitride film formed by ECR (ECR-SiN)/monocrystalline silicon.

Further, samples 1–11 to 1–179 were prepared by taking all the combinations of the first surface materials of 18 kinds and the second surface materials of 9 kinds shown in the following. (it is to be noted that the sample numbers 1–10, 20, 30, 40, 50, 60, 70, 80, 90, 100, 110, 120, 130, 140, 150, 160 and 170 are lacking.) The first surface materials employed were monocrystalline silicon (mono-Si), polycrystalline silicon (poly-Si), amorphous silicon (a-Si), tungsten (W), molybdenum (Mo), tantalum (Ta), tungsten silicide (WSi), titanium silicide (TiSi), aluminum (Al), aluminum silicon (Al—Si), titanium aluminum (Al—Ti), titanium nitride (Ti—N), copper (Cu), aluminum silicon copper (Al—Si—Cu), aluminum palladium (Al—Pd), titanium (Ti), molybdenum silicide (Mo—Si), and tantalum silicide (Ta—Si). The second substrate surface materials employed were T—$SiO_2$, $SiO_2$, BSG, PSG, BPSG, P—SiN, T—SiN, LP—SiN and ECR-SiN. In all these samples, there could be obtained satisfactory Al films comparable to those in the aforementioned samples 1—1.

Subsequently the Al was non-selectively deposited by sputtering on the substrates subjected to the selective Al deposition as explained above, and was then patterned.

The Al film obtained by sputtering and the selectively deposited Al film in the apertures showed electrically and mechanically satisfactory contact, because of the improved surface state of the Al film in the apertures.

Figure 11:
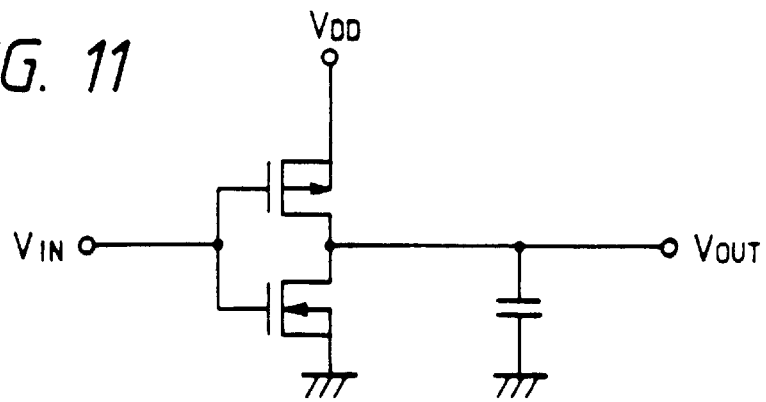
FIG. 11 is a circuit diagram of a part of the semiconductor integrated circuit to which the present invention is advantageously applicable.

FIG. 11 is a circuit diagram showing a part of an integrated semiconductor circuit, in which the present invention can be advantageously applied.

More specifically, the present invention is applied to the filling, with metal wirings, of the contact hole and the first and second through-holes of the inverter circuit shown in FIG. 11.

Figure 12:
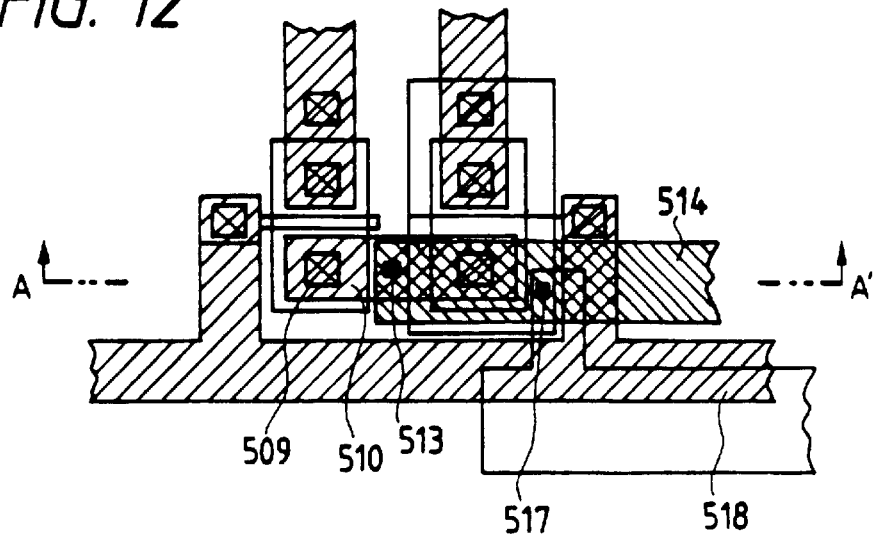
FIG. 12 is a schematic plan view of the inverter circuit shown in FIG. 11.
Figure 13:
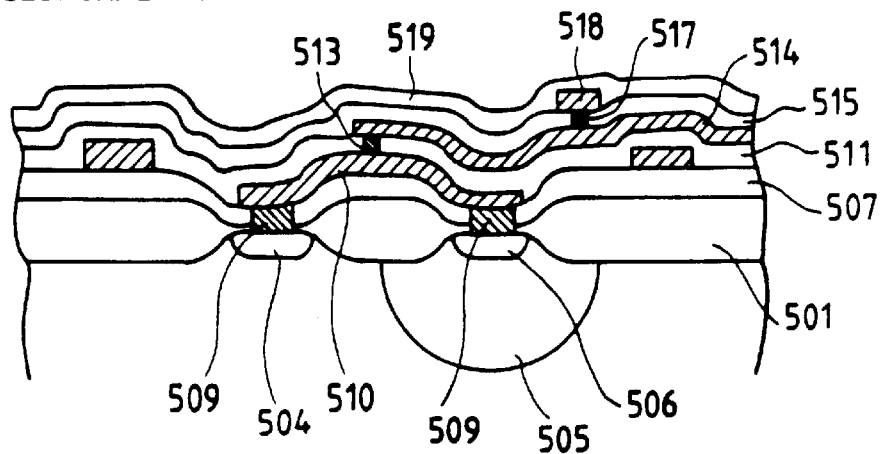
FIG. 13 is a schematic cross-sectional view along a line A—A' in FIG. 12.

FIG. 12 is a schematic plan view of the inverter circuit shown in FIG. 11, and FIG. 13 is a schematic cross-sectional view along a line A—A' in FIG. 12.

In the following the manufacturing process of a semiconductor circuit device shown in FIGS. 14 and 15 will be explained. The deposition of the wiring layers will be only briefly explained as it is same as already explained before.

Figure 14A:
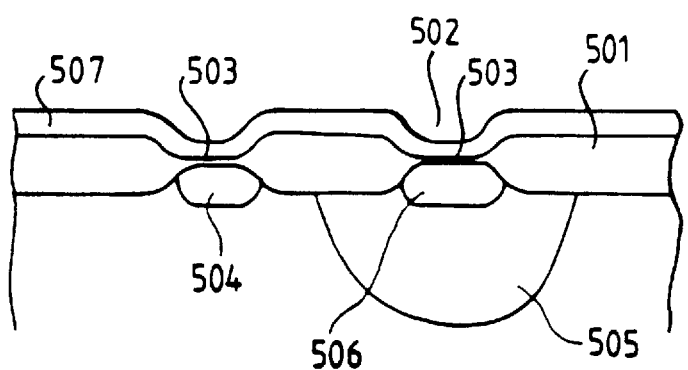
FIGS. 14A to 14D are schematic cross-sectional views showing the manufacturing process of the embodiment shown in FIG. 13.

At first a field oxide film 501 and an active area 502 were prepared by a conventional selective oxidation process. The active area contains a PMOS source-drain area 504 formed through a gate oxide film 503, and an NMOS source-drain area 506 in a P-3411 505. An interlayer insulation film 507 was deposited thereon for example by CVD (FIG. 14A). After the source-drain areas 504, 506 were exposed by forming contact holes 508 with a conventional photolithographic process in the interlayer insulation film 507 and the gate oxide film 503, Al films 509 were deposited in said contact holes 508 by the above-explained Al-CVD method, with a substrate temperature of 270° C., a DMAH partial pressure of $4 \times 10^{-3}$ Torr and a total pressure of 1.2 Torr.

Figure 14B:
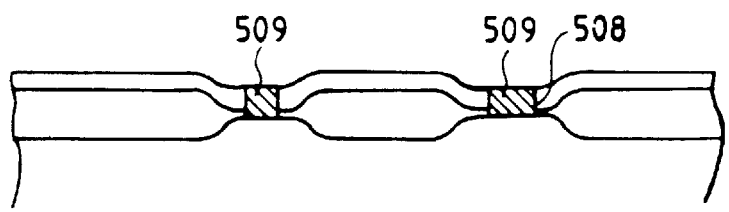

The deposition was terminated when the contact holes 508 were completely filled. The interlayer insulation film 507 and the Al films 509 deposited in the contact holes constituted a substantially flat surface (FIG. 14B).

Figure 14C:
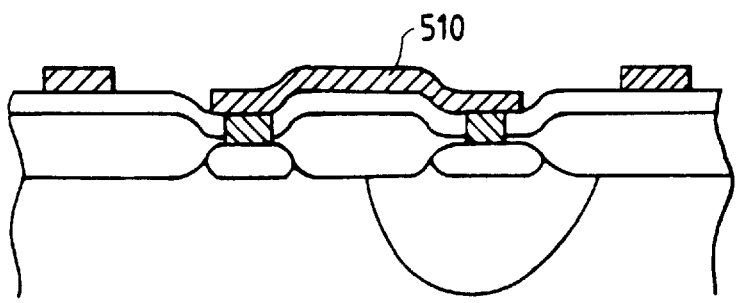

Then Al—Cu (1.5%) was deposited over the entire substrate by sputtering as explained before, and was selectively removed by a conventional photolithographic process to complete a first Al wiring layer 510 (FIG. 14C).

Figure 14D:
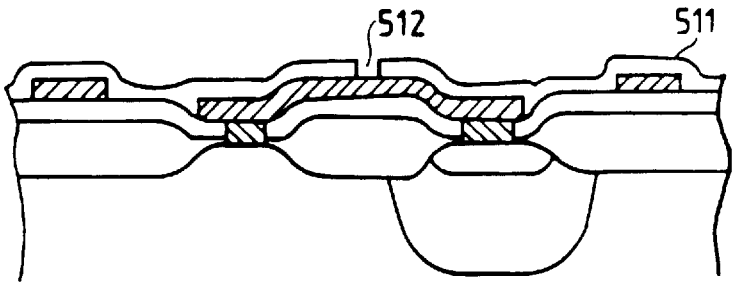

Subsequently SiON was deposited with a thickness of 4000 Å on the substrate surface by a plasma CVD apparatus, then SOG (spin-on glass) was applied by spin coating, and was baked at 420° C. After the SOG in the flat areas was removed, PSG was deposited with a thickness of 3000 Å by a normal pressure CVD method, thereby forming a second inter-layer insulation film 511. Subsequently a first through-hole 512 was opened by the above-explained method (FIG. 14D).

Figure 15A:
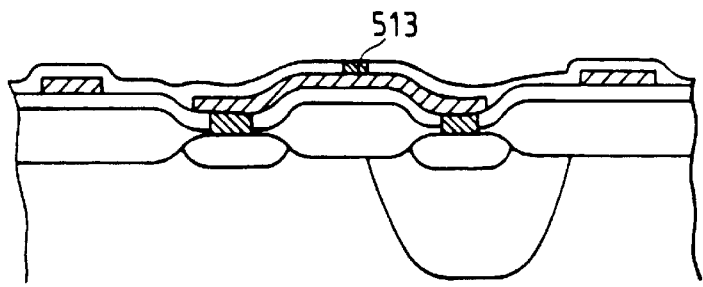
FIGS. 15A to 15D are schematic cross-sectional views showing the manufacturing process of the embodiment shown in FIG. 13.

An Al film 513 was formed in the first through-hole 512 under the same conditions as those in the aforementioned Al-CVD method (FIG. 15A).

Figure 15B:
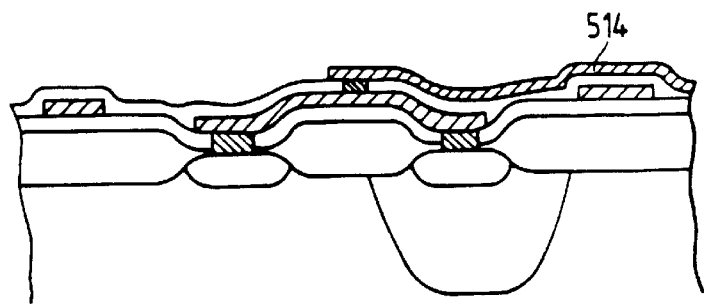

Then a second wiring layer 514 consisting of Al—Cu (1.5%) was formed by the above-mentioned sputtering method (FIG. 15B).

Figure 15C:
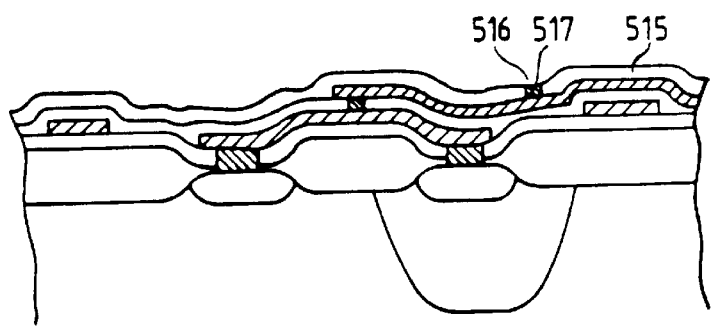

Subsequently a third interlayer insulation film 515 was formed by depositing SiON with a thickness of 6000 Å by the plasma CVD apparatus, then a second through-hole 516 was opened with the above-explained method, and an Al film 517 was deposited therein by the Al-CVD method (FIG. 15C).

Figure 15D:
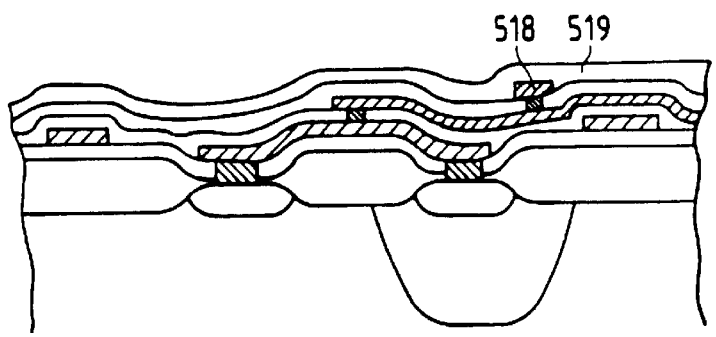

Then a third wiring layer 518 was formed by the above-mentioned sputtering method (FIG. 15D).

Finally a protective insulation film 519 was formed by an ordinary method.

Since Al or Al alloy is filled solely in the apertures as shown in FIGS. 14 and 15, the Al wirings are completely free from recessed portions as encountered above the apertures in the conventional technology, and remain completely flat.

A logic IC of a chip size of 3.8×4.2 mm² manufactured according to the present invention, attained a production yield of 84%, and showed no defects after a test of 100 heat cycles from −40° C. to 80° C. The mask sizes used were as follows:

Contact hole: 0.8 µm square

First through-hole: 0.5 µm square

Second through-hole: 0.6 µm square.

(Comparative Example 1)

A semiconductor circuit device was prepared with the aforementioned conventional process, employing:

contact hole: 0.8 µm square first through-hole: 1.4 µm square second through-hole: 2.0 µm square The device showed steps on the contact holes, first and second through-holes.

Thus the chip size was 3.9×4.5 mm², corresponding to an increase of about 10%, in comparison with the preceding example, and the production yield was 20–25%. Also in the above-mentioned heat cycle test, there was generated a defective chip per 100 chips at the 50th cycle.
(Reference Example)

A semiconductor circuit device was prepared with the above-explained selective and non-selective depositions, employing:

contact hole: 0.8 μm square first through-hole: 1.4 μm square second through-hole: 2.0 μm square without step above the contact holes, and first and second through-holes.

The production yield was 60–65%, and the defective rate in the aforementioned heat cycle test was 1/100 after 50 cycles and 2/100 after 100 cycles.

In addition, photoelectric converting devices and image processing high-speed amplifiers were prepared by the method of the present invention and by the conventional process. Table 2 shows the comparison of the aperture rate (area percentage not covered by the wirings) of the photoelectric converting device and the response speed of the high-speed amplifier between the example 1 of the present invention and the comparative examples 1 and 2.

TABLE 2

|  | Example 1 | Comp. Ex. 1 | Comp. Ex. 2 |
|---|---|---|---|
| Aperture rate of photoelectric converting device | 69% | 52% | 52% |
| Response speed of image processing high-speed amp. | 80 MHZ | 50 MHZ | 58 MHZ |

As shown in Table 2, the example of the present invention showed superior results to those of the comparative examples 1, 2 obtained by the conventional process.
(Example 2)

In the following there will be explained, with reference to FIG. 16, the wiring in case of forming an integrated circuit by connecting functional semiconductor elements such as a MOSFET, bipolar transistor, resistor, capacitor etc.

FIG. 16 shows, in schematic cross-sectional views, the method of forming two-layered metal wirings for a semiconductor integrated circuit according to the present example.

At first prepared was a semiconductor substrate 601 consisting of monocrystalline silicon and bearing semiconductor functional elements such as transistors on the main surface thereof.

On the elements there were formed an upper BPSG layer and a thermally oxidized interlayer insulation film 602 constituting a lower layer, and a contact hole CH was opened through the insulation film 602.

Figure 16A:
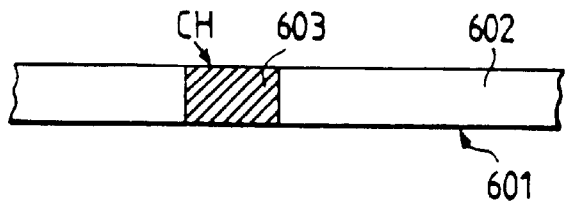
FIGS. 16A to 16E are schematic cross-sectional views showing a wiring forming method constituting a second embodiment of the present invention.

In the contact hole, Al—Si 603 was selectively deposited as a first conductive material by the Al-CVD method, up to a level substantially same as the surface of the interlayer insulation film 602 (FIG. 16A).

The selective deposition was conducted under the following conditions:

DMAH partial pressure: $5 \times 10^{-3}$ Torr $H_2$ partial pressure: 1.5 Torr

Substrate temperature: 270° C.

$Si_2H_6$ partial pressure: $2 \times 10^{-6}$ Torr

The Al—Si obtained under these conditions filled the contact hole completely, and showed satisfactory film quality without carbon or oxygen content and with a resistivity of 3.0–3.1 μΩcm. Also the selectivity was satisfactory as no deposition was recognized on the interlayer insulation film 602.

Subsequently N-type polycrystalline silicon 604 was deposited with a thickness of 450 Å as a second conductive material, over the entire surface of the substrate, by a low pressure CVD method utilizing $SiH_4$ and $PH_3$.

The polycrystalline silicon was partially eliminated, except for the electrode and wiring areas, by reactive ion etching (RIE) in an atmosphere of $CCl_2F_2+N_2$ utilizing a conventional photolithographic process, thereby forming a lower layer of the first wiring layer. Subsequently Al—Cu 605 was deposited, as a third conductive material, solely on said N-type polycrystalline Si by means of the Al-CVD method under the conditions:

DMAH partial pressure: $5 \times 10^{-3}$ Torr $H_2$ partial pressure: 1.5 Torr

Substrate temperature: 270° C.

$Cu(C_2H_7O_2)_2$: $5 \times 10^{-6}$ Torr.

Figure 16B:
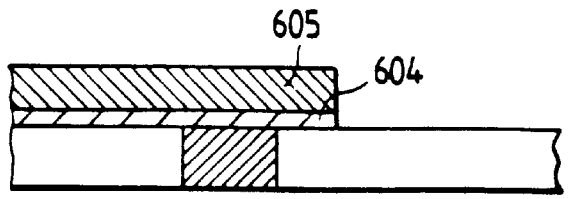

Under these conditions, an Al—Cu film (Cu content: 1.5%) was deposited solely on the remaining polycrystalline Si with complete selectivity, thereby completing the first wirings (FIG. 16B).

Figure 16C:
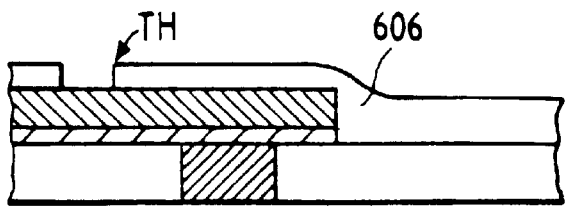

There were subsequently conducted deposition of SiON with a thickness of 5000 Å by plasma CVD on the substrate surface, SOG coating over the entire surface for planarization, thermal treatment at 420° C. in $N_2$ atmosphere, deposition of PSG with a thickness of 3000 Å as a second interlayer insulation film 606 by normal pressure CVD, and formation of a through-hole TH in a desired position (FIG. 16C).

Figure 16D:
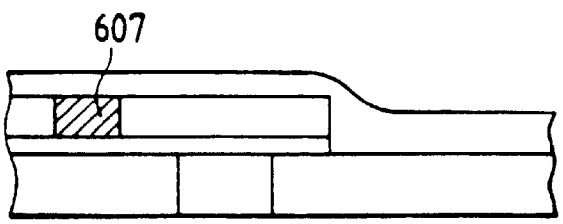

Then Al—Cu (Cu content: 1.5%) was deposited solely in the through-hole by said Al-CVD method, up to a level substantially equal to the surface of the second interlayer insulation film 606, thereby obtaining an Al—Cu film 607 (FIG. 16D).

On the substrate Cu was deposited with a thickness of 2000 Å by sputtering, under the conditions:

DC power: 7 kW substrate temperature: 200° C.

Ar partial pressure: $2 \times 10^{-3}$ Torr.

The obtained Cu film 608 was partially eliminated by a photolithographic process to obtain a lower layer of second wirings.

Figure 16E:
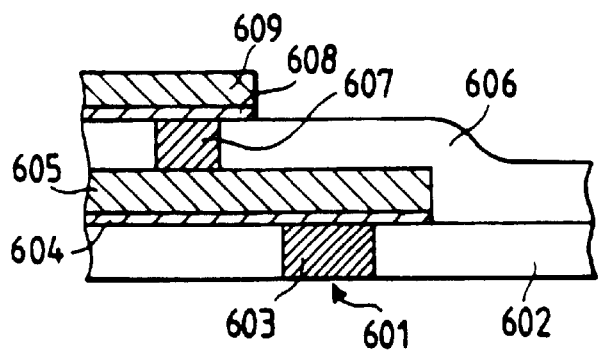

Then Al—Cu (Cu content: 1.5%) was deposited with a thickness of 500 Å solely on the Cu film 608 by means of the Al-CVD method, thereby completing the second wirings (FIG. 16E).

The multi-layered wiring structure was thus completed.

As detailedly explained in the foregoing, the present example can form wirings on the semiconductive, conductive and insulating surfaces with a simple process, utilizing the advantage of the Al-CVD method capable of forming a metal film of satisfactory quality with excellent selectivity. The wiring has a low resistance because of the excellent crystallinity, and is extremely suitable for semiconductor devices designed and integrated with a submicron rule, because of the excellent antimigration resistance.

Also the reduced frequency of recesses above the apertures improves not only the yield and durability of the wirings but also the coverage of the insulation layer, thereby increasing the yield and durability of the insulation layer and eventually the production yield and durability of the devices themselves.
(Example 3)

The process of the example 2 was reproduced, except that Al deposition was conducted without Cu-containing gas, in contrast to the example 2 in which Al—Cu was deposited by the Al-CVD method.

The Al film in this example was mono-crystalline at least in the contact hole, showing extremely good wiring characteristics.

(Example 4)

This example employs a film forming method utilizing light, for forming the lower layer of the wiring layer.

Figure 17:
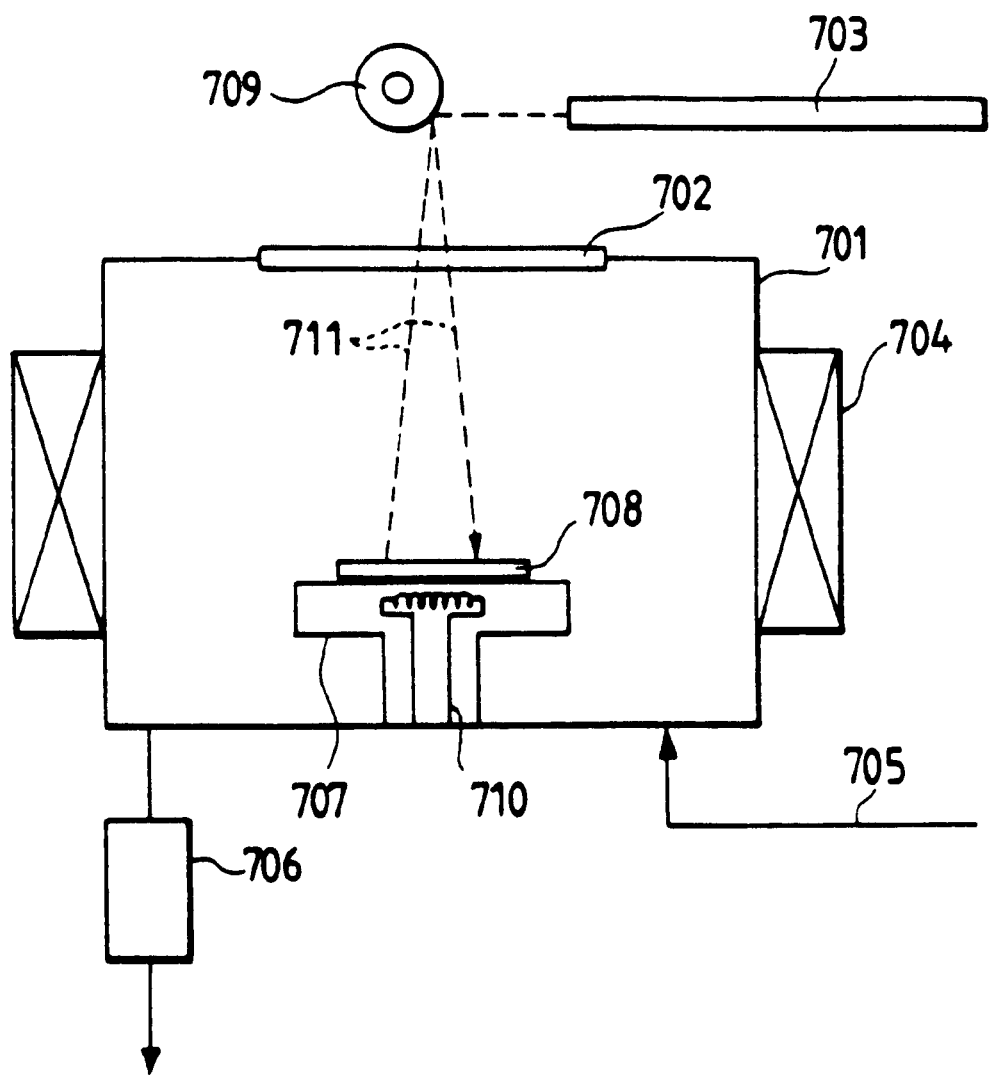
FIG. 17 is a schematic view of a film forming apparatus adapted for use in a wiring forming method constituting a fourth embodiment of the present invention.
Figure 18A:
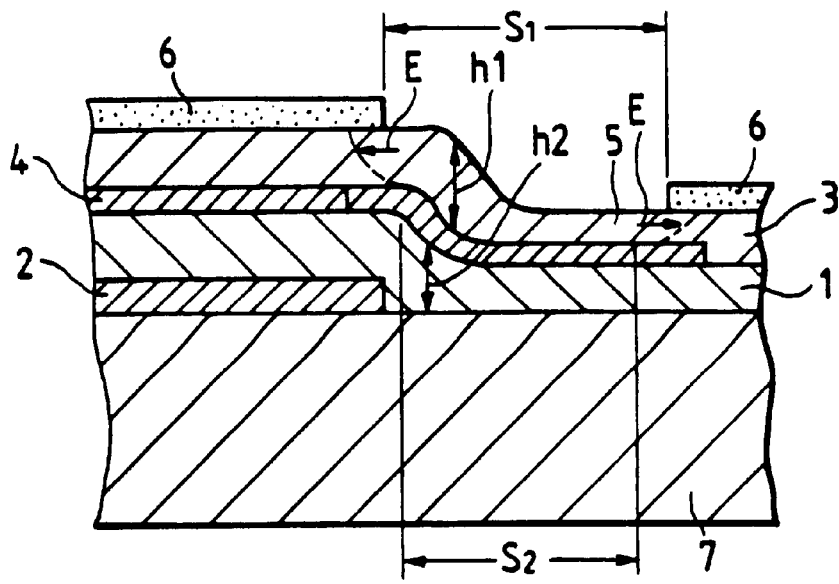
FIGS. 18A and 18B are schematic cross-sectional views of a conventional semiconductor circuit device.
Figure 18B:
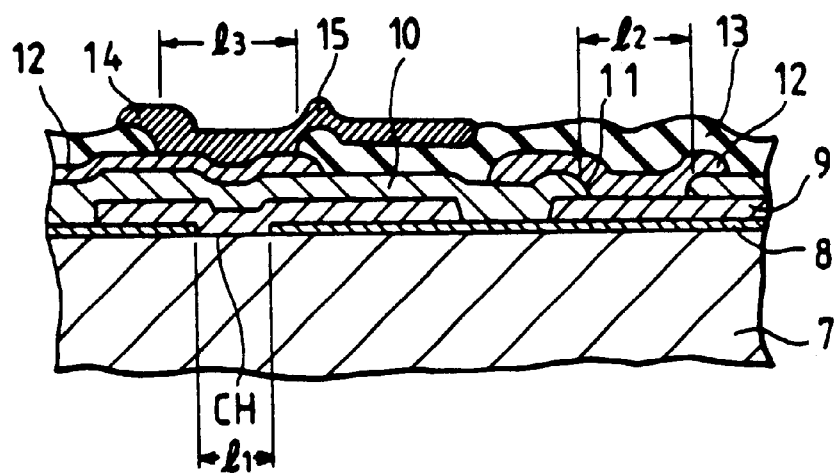
Figure 19A:
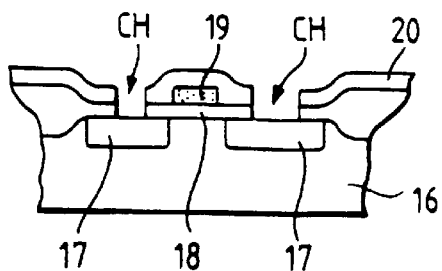
FIGS. 19A to 19D are schematic cross-sectional views showing a conventional wiring forming method.
Figure 19B:
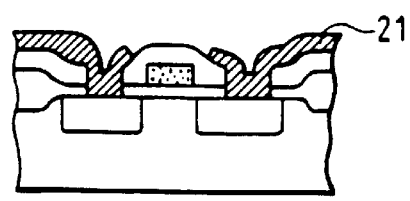
Figure 19C:
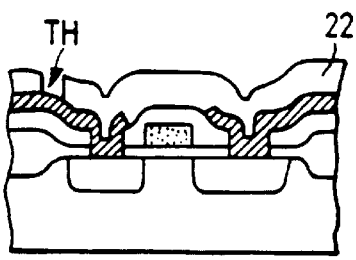
Figure 19D:
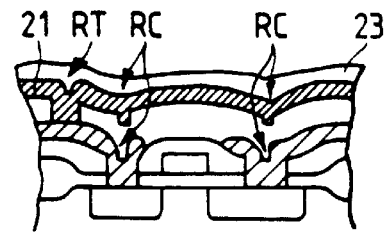
Figure 20:
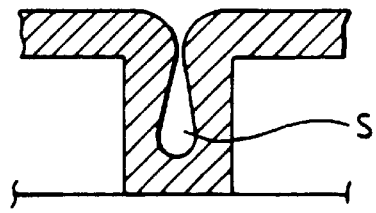
FIG. 20 is a schematic cross-sectional view showing a conventional wiring structure.

FIG. 17 schematically illustrates a film forming apparatus adapted for use in the present example.

A reaction chamber 701 is provided, as the top thereof, with a window 702 transmitting the laser beam. Surface of a substrate 708 can be scanned with a laser beam coming from a light source 703, deflected by a polygon mirror 709 and transmitted by the window 702.

The chamber 701 is provided with a gas supply pipe 705 for introducing the raw material gas and reaction gas, and can be evacuated by a vacuum device 706.

There are also provided a movable stage 707, a heater 710 for preliminary heating of the substrate, and a gate valve 704 for introducing the substrate.

The wirings can be formed with the apparatus, according to the following procedure.

A semiconductor substrate bearing an insulation film thereon with contact holes therein is subjected to selective Al deposition in the contact hole by the Al-CVD method.

Then, in the film forming apparatus shown in FIG. 17, laser beam scanning is conducted according to the pattern of the electrodes to be formed, in $WF_6$ atmosphere. The areas irradiated with the laser beam are heated, thus inducing W deposition. Then the atmosphere in the chamber is replaced by a mixture of DMAH gas and hydrogen gas, and the wirings are obtained by depositing Al by the Al-CVD method, on the tungsten deposited according to the wiring patterns.

Thus the present example can provide the wirings without the photolithographic process.

The specific conditions of this example are as follows.

The chamber 701 was supplied with $WF_6$ at 30 cc/min., $SiH_4$ at 8 cc/min., and $H_2$ at 1000 cc/min. with a total pressure of $10^{-3}$ Torr. The areas for forming wirings on the substrate 708 were irradiated by a laser beam 711, coming from the light source 703 and deflected by the polygon mirror 709, thus being locally heated. Tungsten was deposited with a thickness of 1000–1500 Å in thus locally heated areas. Then the chamber 701 was evacuated to $10^{-6}$ Torr, and supplied with DMAH gas, obtained by bubbling, and $H_2$ gas through the gas supply line 705, and the substrate was heated to 270° C. by the heater 710. Aluminum could be deposited on the previously deposited tungsten. In this manner the present example could provide metal wirings of a low resistance on the substrate, without relying on the photolithographic process.

As explained in the foregoing, the present invention is capable of increasing the density of wirings in the upper layers and decreasing the parasitic capacitances in such wirings, thereby significantly improving the characteristics of the semiconductor circuit devices and the production yield thereof, in comparison with the conventional technologies.

In addition, the present invention can form the second wirings in self-aligning manner without a patterning process by etching, thus providing uniform profiles by a simple process.

What is claimed is:

1. A method for producing a wiring for a semiconductor circuit, comprising the steps of:

forming on a semiconductor substrate an insulating film having a contact hole;

forming in the contact hole a metal comprising aluminum and copper by CVD using a gas of alkylaluminum hydride, a gas of hydrogen and a gas containing copper atoms;

forming on the insulating film a conductive layer comprising a conductive material different from aluminum; and forming on the conductive layer a metal layer comprising aluminum and copper by CVD using a gas of alkylaluminum hydride, a gas of hydrogen and a gas containing copper atoms.

2. The method according to claim 1, wherein the alkylaluminum hydride is dimethylaluminum hydride.

3. The method according to claim 1, wherein a part of the conductive layer is removed and the metal layer is formed only on the remaining part of the conductive layer.

* * * * *

UNITED STATES PATENT AND TRADEMARK OFFICE
CERTIFICATE OF CORRECTION

PATENT NO.      : 6,245,661 B1
DATED           : June 12, 2001
INVENTOR(S)     : Shigeyuki Matsumoto et al.

It is certified that error appears in the above-identified patent and that said Letters Patent is hereby corrected as shown below:

Column 3,
Line 6, "of the" should read -- if the --;
Line 27, "a" should read -- of a --;
Line 30, "the" should be deleted;
Line 53, "said" should read -- the --;
Line 57, "a" should be deleted; and
Line 60, "said" should read -- the --.

Column 4,
Lines 4, 26 and 28, "said" should read -- the --;
Line 5, "said" (both occurrences) should read -- the --; and
Line 49, "as" should be deleted.

Column 6,
Line 6, "allu-" should read -- alu- --.
Line 22, "system" should read -- systems --; and Column 7,
Line 3, "other" should read -- other than --.
Line 50, "on" should read -- of --.

Column 8,
Line 25, "FIG. 8D)." should read -- (FIG. 8D). --.

Column 9,
Line 56, "chember" should read -- chamber --.

Column 10,
Line 31, "substrate)" should read -- substrate --.

Column 12,
Line 19, "said" should read -- the --.
Line 20, "relationship" should read -- relationship: --.

UNITED STATES PATENT AND TRADEMARK OFFICE
CERTIFICATE OF CORRECTION

PATENT NO.    : 6,245,661 B1
DATED         : June 12, 2001
INVENTOR(S)   : Shigeyuki Matsumoto et al.

It is certified that error appears in the above-identified patent and that said Letters Patent is hereby corrected as shown below:

<u>Column 14,</u>
Line 52, "2000º-250ºC." should read -- 200º-250ºC. --.

Signed and Sealed this

Sixteenth Day of July, 2002

Attest:

Attesting Officer

JAMES E. ROGAN
*Director of the United States Patent and Trademark Office*